United States Patent [19]
Dimitrov et al.

[11] Patent Number: 5,456,204
[45] Date of Patent: Oct. 10, 1995

[54] FILTERING FLOW GUIDE FOR HYDROTHERMAL CRYSTAL GROWTH

[75] Inventors: Vesselin S. Dimitrov, Caracas, Venezuela; Navtej S. Saluja, Arlington, Mass.; Alfredo Riviere V., Caracas, Venezuela

[73] Assignee: Alfa Quartz, C.A., Cua

[21] Appl. No.: 69,040

[22] Filed: May 28, 1993

[51] Int. Cl.$^6$ .................................................. C30B 7/10
[52] U.S. Cl. ............................ 117/71; 117/72; 117/224
[58] Field of Search ........................... 117/71, 72, 224

[56] References Cited

U.S. PATENT DOCUMENTS

| H580 | 2/1989 | Vig . | |
|---|---|---|---|
| 2,447,362 | 8/1948 | Pessel | 117/71 |
| 2,979,413 | 4/1961 | Ballman et al. | 117/71 |
| 2,994,593 | 8/1961 | Sullivan . | |
| 3,051,558 | 8/1962 | Jost | 117/224 |
| 3,245,760 | 4/1966 | Sawyer . | |
| 3,271,114 | 9/1966 | Kolb . | |
| 3,353,926 | 11/1967 | Kolb et al. | 117/71 |
| 4,019,950 | 8/1977 | Croxall et al. | 117/71 |
| 4,579,622 | 4/1986 | Caporaso et al. . | |
| 4,654,111 | 3/1987 | Laudise | 117/71 |

FOREIGN PATENT DOCUMENTS

| 59193101 | 11/1984 | Japan . |
|---|---|---|
| 4132676 | 5/1992 | Japan . |
| 12968/74 | 3/1974 | Switzerland . |

OTHER PUBLICATIONS

Klipov et al. "Influence of Connective Flows on the Growth of Synthetic Quartz Crystals" *Forty-fifth Annual Symposium on Frequency Control* (1991).

Armington et al. "The Growth of High Purity, Low Dislocation Quartz" *Thirty-eight Annual Frequency Control Symposium* (1984).

Johnson et al. "Experimental Determination of the Relationship Among Baffle, Temperature Difference and Power for the Hydrothermal Growth of Quartz" *Forty-third Annual Symposium on Frequency Control* (1989).

Balascio et al. "Factors Affecting the Quality and Perfection of Hydrothermally Grown Quartz" *Thirty-fourth Annual Frequency Control Symposium* (May, 1980).

Annamalai et al. "Effect of Lithium Nitrate and Lithium Nitrate Dopants and Conventional Baffle on the Hydrothermal Growth Rate of Quartz Single Crystals" *Indian Journal of Technology*, 20, 300–304 (Aug. 1982).

Annamalai et al. "Effect of Convection Baffle and Lithium Nitrate and Lithium Nitrate Dopants on Hydrothermal Growth Rate of Quartz Single Crystals" *Indian Journal of Technology*, 21, 425–430 (Oct. 1983).

(List continued on next page.)

*Primary Examiner*—Robert Kunemund
*Attorney, Agent, or Firm*—Choate, Hall & Stewart

[57] ABSTRACT

The present invention is a filtering flow guide for hydrothermal reaction vessels—such as crystal growth apparatus—which improves crystal production efficiency and crystal quality without significantly slowing down flow velocities or crystal growth times. One embodiment of the flow guide fits inside a conventional hydrothermal autoclave for crystal growth, and includes at least one central inlet conduit by which crystal nutrient solution flows from the autoclave's dissolving zone into its growth chamber. A plurality of funnels encircle the inlet conduit, the funnels contiguous with each other along their lateral edges and with the inlet conduit's intake opening at the funnels' innermost edges. Each funnel may be substantially shaped as a hollow, inverted triangular pyramid with a nadir instead of an apex, the nadir opening into a filter-containing outlet. The inlet conduit, plurality of funnels and outlet tubes guide the flow of crystal nutrient solution optimally through the autoclave's dissolving and growth chambers, producing an even flow rate and pattern, and reducing wasteful crystal deposition. The inlet conduit, the funnels, or both elements, may further include optional filters positioned to enhance convective solution flow with minimal flow impedance. The flow guide thereby also filters out contaminants, producing high-purity, high-perfection crystals.

41 Claims, 7 Drawing Sheets

OTHER PUBLICATIONS

Laudise "Hydrothermal Synthesis of Crystals" *C&EN*, 30–43 (Sep. 28, 1987).

Ballman et al. "Hydrothermal Growth" ed. J. J. Gilman *The Art and Science of Growing Crystals*, 231–251 (1963).

Kuznetsov et al. "Hydrothermal Method for the Growth of Crystals" *Soviet Physics—Crystallography*, 17(4), 775–804 (Jan.–Feb. 1973).

Barns et al. "Dislocation–Free and Low Dislocation Quartz Prepared by Hydrothermal Crystallization" *Journal of Crystal Growth*, 43, 676–686 (1978).

Annamalai et al. "Natural Convection Heat Transfer During Hydrothermal Crystal Growth" *Chem.–Ing.–Tech.*, 56(12), 950–951 (1984).

FILTERING FLOW GUIDE FOR HYDROTHERMAL CRYSTAL GROWTH

BACKGROUND OF THE INVENTION

The present invention relates generally to hydrothermal apparatus and methods for growing single crystals, and particularly, to guiding flow and filtering solution within hydrothermal growth processes.

There exists a great demand for single crystals, such as α-quartz, of high purity and crystalline perfection for frequency control applications in the radio, television, telecommunications, and electronics industries. Hydrothermal techniques have been used to grow high-perfection single crystals for these and other applications.

To summarize the conventional process, a near-insoluble crystal nutrient starting material is immersed in an aqueous solvent within a closed-volume, steel autoclave. The contents are super-heated, thereby expanding the solvent to fill the entire autoclave, pressurizing the contents, and inducing dissolution of the crystal nutrient in a first zone of the autoclave. A temperature gradient is applied to encourage convective flow or the nutrient-laden solution from the first zone to a second zone having a different temperature. The solution reaches its saturation point and the crystal nutrient precipitates out in the second zone. Racks of seed crystals are usually provided in the second zone as nucleation points in order to minimize random self-nucleation of the nutrient. The reader is directed to the prior art on hydrothermal crystal apparatus and methods for greater details than disclosed in the following paragraphs. See, e.g., Sullivan, U.S. Pat. No. 2,994,593 (Aug. 1, 1961); Kolb, U.S. Pat. No. 3,271,114 (Jun. 15, 1964); V. A. Kuznetsov and A. N. Lobachev, "Hydrothermal Method for the Growth of Crystals", Soviet Physics —Crystallography, vol. 17, no. 4 (January-February, 1973); R. A. Laudise, "Hydrothermal Synthesis of Crystals", Special Report, C&EN, Sep. 28, 1987, pp. 30–42.

Several factors affect the quality of hydrothermally grown crystals and the efficiency of crystal production. They include: impurities present in the starting materials or introduced into the solution by corrosion of the autoclave vessel and baffle; the quality of the seed crystals used for nucleation; flow patterns of the dissolved nutrient within standard autoclave set-ups; baffle designs; and dissolved nutrient within standard autoclave set-ups; baffle designs; and temperature and pressure fluctuations affecting uniformity of growth rates. See, e.g., Balascio et al., "Factors Affecting the Quality and Perfection of Hydrothermally Grown Quartz", Proc. 34th Annual Symposium on Frequency Control, 65–71 (1980); Klipov et al., "Influence of Convective Flows on the Growth of Synthetic Quartz Crystals", Proc. 45th Ann. Symp. Freq. Control, 29–36 (1991); Johnson et al., "Experimental Determination of the Relationship among Baffle, Temperature Difference and Power for the Hydrothermal Growth of Quartz", 43rd Ann. Symp. Freq. Control, 447–458 (1989).

Various efforts have been directed at controlling these factors. For example, inert or noble metal linings have been proposed for reaction vessel walls, baffles, seed racks and seed clips. Such linings better withstand the solvent's corrosive effects and minimize formation of iron and other metal silicates, thereby reducing inclusions within the final crystals. Etched, dislocation-free seed may also be used on which to grow low-dislocation crystals for high-frequency applications. See, e.g., Barns et al., "Dislocation-free and low-dislocation quartz prepared by hydrothermal crystallization", J. Crystal Growth 43, 676–686 (1978); Croxall et al., "Growth and Characterization of High Purity Quartz", Proc. 36th Ann. Symp. Freq. Control, 62–65 (1982); Armington et al., "The Growth of High Purity, Low Dislocation Quartz", Proc. 38th Annual Symp. Freq. Control, 3–7 (1984). Greater amounts of aqueous solution may be used in low-pressure hydrothermal crystal growth processes to produce high-quality crystals of silicon-free materials. See, e.g., Caporaso et al., U.S. Pat. No. 4,579,622 (Apr. 1, 1986).

Persons skilled in the art of hydrothermal crystal growth have also recognized that dissolved nutrient and solvent flow back and forth randomly, even turbulently, between dissolving and growth zones of an autoclave. This problem is inherent with the use of conventional baffles-flat perforated disks-which tend to promote random mixing rather than convection. See, e.g., Annamalai et al., "Effect of Convective Baffle & Lithium Nitrite and Lithium Nitrite Dopants on Hydrothermal Growth Rate of Quartz Single Crystals", 21 Indian J. Tech. 425–430 (October 1983). Random flow promotes wasteful nucleation of dissolved nutrient on autoclave walls and components, and the solvent's corrosion of these components which are typically made of steel. As well, significant amounts of impurities —including iron or aluminum silicates and gas bubbles—accumulate to form inclusions in the crystals grown. Furthermore, crystal formation is non-uniform throughout the autoclave's growth zone, according to the influence of concentrative and convective flows. Klipov et al., Proc. 45th Ann. Symp. Freq. Control, 29–36 (1991).

Annamalai et al. discussed the desirability of a better mechanism of fluid flow within hydrothermal systems: i.e., convective fluid flow is preferred over random mixing of cooler and hotter fluids within a hydrothermal system. They discuss the merits of a "convection baffle" of their design in promoting convective flow, but disclose no specific details of their baffle design. They experimented with adding syphons and extending tubes to their baffle to minimize mixing at the fluid exchange boundary, but soon abandoned these fixtures as significantly impeding flow rate. Annamalai, 21 Indian J. Tech. at 426, col. 2.

In U.S. Invention Reg. No. H580 (Feb. 7, 1989), "Method and Apparatus for Growing High Perfection Quartz", Vig imposed "forced convection" on a hydrothermal system to reduce crystal imperfections and inclusions. A separate filter vessel and pump are attached to a crystal growth autoclave to circulate solution through the autoclave in one direction-from dissolving zone to growth zone to filter vessel back to dissolving zone-in a continuously recirculating pathway. However, use of a second autoclave as a filter vessel complicates and lengthens the hydrothermal process, and adds significantly to the cost of hydrothermal crystal growth. The filter vessel increases the volume of the system, thereby making it more difficult to maintain constant pressure and to control zone temperatures. Furthermore, forced convection tends to carry contaminant particles along with the crystal nutrient solution, increasing the risk of crystal inclusions. Vig's device provides a filter to remove contaminant particles from nutrient-depleted solution, but only after the dissolved nutrient and contaminants have already passed through the growth chamber.

Therefore, an unfulfilled need remains for a simple, cost-effective way to improve flow patterns in conventional hydrothermal crystal growth apparatus, thereby improving crystal quality and the efficiency of crystal production such that wasteful crystal deposition is minimized. There also remains a need for reducing the level of impurities present in the nutrient-laden solution during crystal growth, which reduces the inclusion density and increases the degree of crystal perfection.

SUMMARY OF THE INVENTION

The present invention provides an inexpensive and simple means for improving flow of and filtering solution within processes such as hydrothermal crystal growth, thereby improving crystal quality and efficiency of crystal production. Specifically, this invention can both filter and guide a flow of crystal nutrient-laden and -depleted solution optimally through a hydrothermal reaction vessel's dissolving and growth zones, thereby reducing crystal inclusions and flaws and avoiding wasteful crystal deposition on the vessel walls. The filtering flow guide of this invention thereby produces high-purity, high-perfection crystals and maximizes efficiency of crystal production. Furthermore, the invention is easily adapted to replace a conventional, prior art baffle, and to fit inside known hydrothermal autoclaves.

In one embodiment, the flow guide has a central inlet conduit and a plurality of tapering funnels sealably abutting each other and radially surrounding the inlet conduit. The flow guide's configuration allows convective flow of solution through the inlet conduit in one direction, and through the funnels in the other direction. The flow guide may be vertically positioned in a standard hydrothermal reaction vessel or autoclave, with the funnels serving to separate the autoclave's dissolving and growth zones. Nutrient-laden solution flows through the central inlet conduit from the dissolving zone to the growth zone. Nutrient-depleted solution flows from the growth zone to the dissolving zone through each funnel. In another embodiment, a filter-containing flow guide is provided wherein filters are disposed within the inlet and outlet conduits so as to trap or adsorb impurities from the crystal solution, while preserving continuous convective solution flow within a hydrothermal reaction vessel.

BRIEF DESCRIPTION OF THE DRAWING

In the drawing:

FIG. 5 illustrates alternative embodiments of the flow guide, with FIGS. 5(a) and (b) being perspective views and FIG. 5(c) a top view of a flow guide having one central inlet conduit surrounded by a plurality of funnels supported in a sealing collar;

FIG. 6 show (a) top and (b) side views of a flow guide having two inlet conduits surrounded by a plurality of funnels supported in a sealing collar, and (c) top and (d) side views of the same further including filters.

DESCRIPTION OF THE PREFERRED EMBODIMENT

The filtering flow guide of this invention is designed to prevent random or turbulent flow patterns of both crystal-laden and crystal-depleted solution between the dissolving and growth chambers of an hydrothermal reaction vessel and along the vessel's interior surfaces, and to filter out contaminants in the solution.

Figure 1:
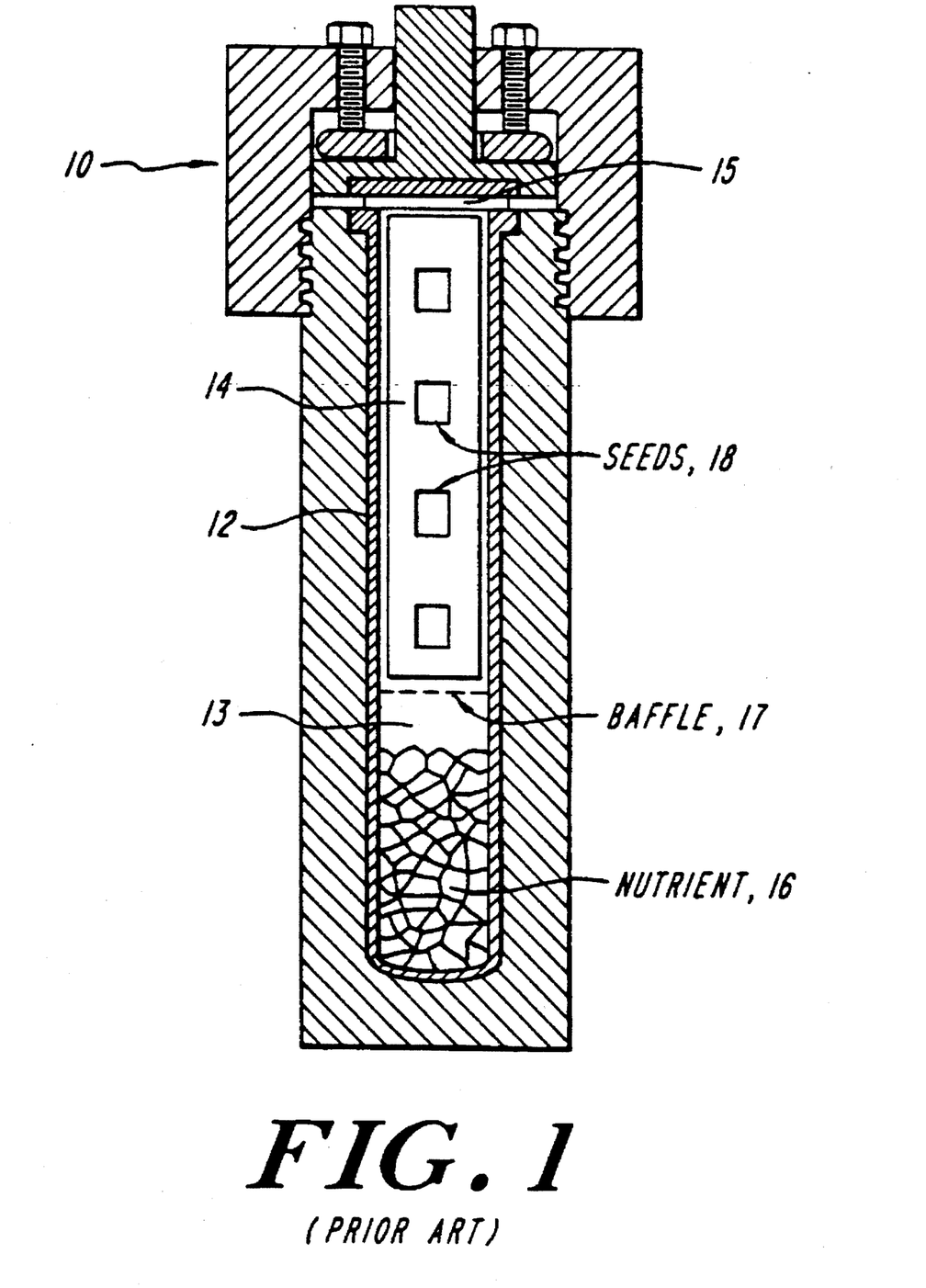
FIG. 1 is a schematic representation of an hydrothermal crystal growth apparatus.

FIG. 1 shows a schematic of a conventional hydrothermal crystal growth apparatus, comprising a vertical autoclave or reaction vessel 12 contained within a furnace 10. The reaction vessel has two chambers or zones maintained at different temperatures by surrounding heater bands: a "dissolving zone" 13 and a "growth zone" 14. The solubility of most crystals and their minerals increases with temperature, so conventionally, the dissolving zone 13 is located at the bottom of the autoclave and is at a higher temperature than the growth zone 14 located at the top of the autoclave. A prior art baffle 17—typically a perforated disk—is shown in FIG. 1 to separate the dissolving and growth chambers 13 and 14, for maintaining the temperature differential between those zones while permitting flow of solution between the dissolving and growth chambers. The reaction vessel 12 has an opening at the top of the growth zone 14, which is sealed shut by a sealing closure 15 after the reaction vessel 12 is filled with the appropriate starting materials for the hydrothermal crystal growth process.

In the dissolving zone 13, a crystal nutrient 16 such as crushed quartz, is immersed in an aqueous solvent, such as a strongly basic solution of sodium hydroxide or sodium carbonate. The solvent's starting volume is usually at least one-third of the reaction vessel 12, and may be varied according to the desired pressure upon super-heating. The solvent is heated to supercritical conditions, allowing it to expand to fill the vessel 12 and to dissolve the crystal nutrient supply 16. Hydrothermal conditions may be varied according to the desired hydrothermal reaction or crystal product. For instance, typical conditions for growing electronic grade quartz require reaction pressures of about 1000–2000 atm, and temperatures of 325°–450° C. in the dissolving zone and 300°–400° C. in the growth zone (i.e., the latter is 25°–100° C. cooler than the dissolving zone).

The crystal nutrient-laden solution flows upwardly from the hotter dissolving zone 13 into the cooler growth zone 14, by natural or "buoyant" convection. The nutrient-laden solution becomes super-saturated in the cooler growth zone and excess crystal solute precipitates out of solution. Typically, racks of seed crystal 18, like $\alpha$-quartz, are provided as nucleation points, resulting in more orderly growth of single crystals. The cooled, nutrient-depleted solution then sinks back down to the dissolving zone 13, where it reheats, dissolves more of the nutrient supply 16 and flows upward again. The hydrothermal cycle repeats itself until the nutrient supply 16 is exhausted. The hydrothermal crystal growth process typically takes days to months to grow crystals suitable for commercial use.

In a few instances in which a crystal's solubility decreases as temperature increases beyond a certain range, the positions of the dissolving and growth zones may be reversed. A cooler dissolving chamber which supports a nutrient supply would be located on top of a warmer growth chamber. The crystal nutrient-laden solution would flow convectively from the upper chamber down into the lower growth chamber where the nutrient would crystallize.

Figure 2:
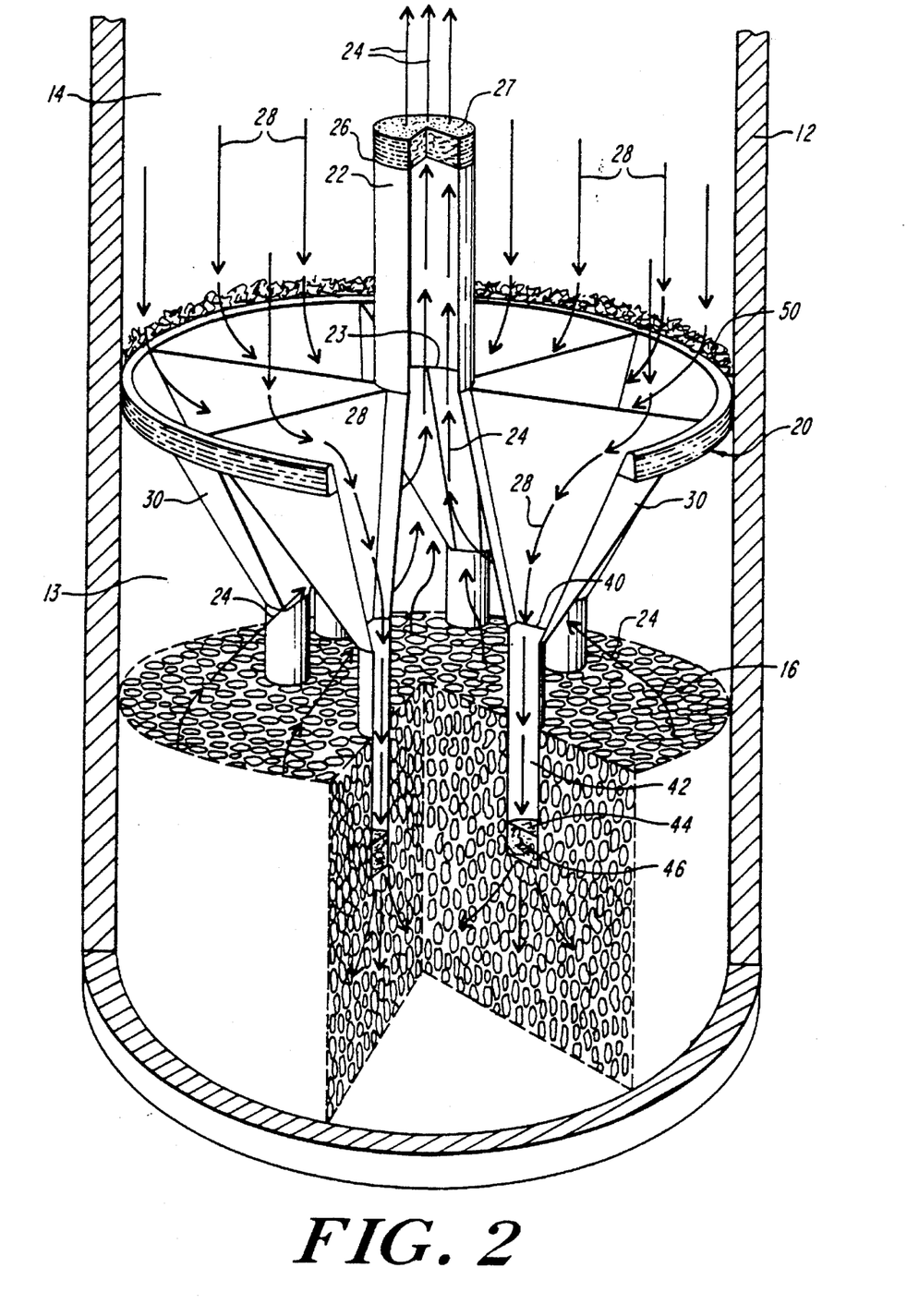
FIG. 2 is a cut-away, perspective view of a filter-containing flow guide of this invention placed within a conventional, cylindrical hydrothermal autoclave (not drawn to scale), with arrows indicating a desired convectional flow pattern for the dissolved crystal.

FIG. 2 shows a filter-containing flow guide 20 of this invention, specifically adapted to fit inside a cylindrical hydrothermal autoclave or reaction vessel 12 in which the crystal growth zone 14 lies atop a bottom dissolving zone 13. The flow guide 20 may be made of tempered steel or other suitable material for withstanding the temperatures, pressures, and corrosive conditions of the hydrothermal process. Inert or noble metals or nickel-based super-alloys may be used to make or to coat the flow guide 20 for even fewer crystal flaws.

Referring generally to FIGS. 2–5, the flow guide 20 has at least one central inlet conduit 22 having a first opening 23 and a second opening 26, the conduit's first opening 23 being within or proximate to the dissolving chamber when the flow guide is placed within a hydrothermal autoclave. The inlet conduit 22 may be fitted with an optional filter 27 comprising trapping material such as wire mesh or steel wool, or suitable adsorbing material. Referring to the embodiments of FIGS. 2 and 7(a), arrows 24 indicate that crystal nutrient-laden solution flows upward from the autoclave's dissolving zone 13, through the first opening 23, along the inlet conduit 22, out through the second opening 26 and filter 27, and into the growth chamber 14. The filter 27 serves to trap trace impurities such as iron and aluminum silicates before the crystal nutrient-laden solution enters the growth chamber 14 where crystal growth occurs. Filtering out impurities from the nutrient-laden solution reduces the amount of inclusions and dislocations in the final crystal product.

A plurality of outlet conduits-shown as outlet funnels 30 in FIGS. 2–5— sealably abut each other and the inlet conduit 22 so as to surround the inlet conduit radially. Optimally, the outlet funnels 30 are fused together in a ring configuration similar to segments in half an orange, while each funnel connects to the inlet conduit 22 at or near the latter's first, inlet opening 23. Each funnel 30 preferably tapers from a first opening 39 to a second opening 40 having a smaller cross-sectional area than the funnel's first opening. In a most preferred embodiment, each funnel 30 is shaped substantially like a hollow, inverted triangular pyramid whose apex is inverted to become the second opening 40 at a nadir of the funnel 30. That is, the outlet funnel 30 has two substantially triangular lateral walls 32 with straight upper edges 31; a curved, substantially triangular outer wall 34 with an outwardly convex upper edge 33; and an inner wall 36 with a concave or inwardly curved upper edge 35 adjoining the inlet conduit 22. Each funnel 30 contiguously adjoins at least one adjacent funnel along the funnels' straight lateral upper edges 31, and adjoins the inlet conduit 22 at the funnel's innermost edge 35. The funnels' outermost edges 33 together form a circle whose outer diameter is substantially equal to the reaction vessel's inner diameter, thereby allowing the flow guide 20 to fit snugly within the reaction vessel 12.

Figure 3:
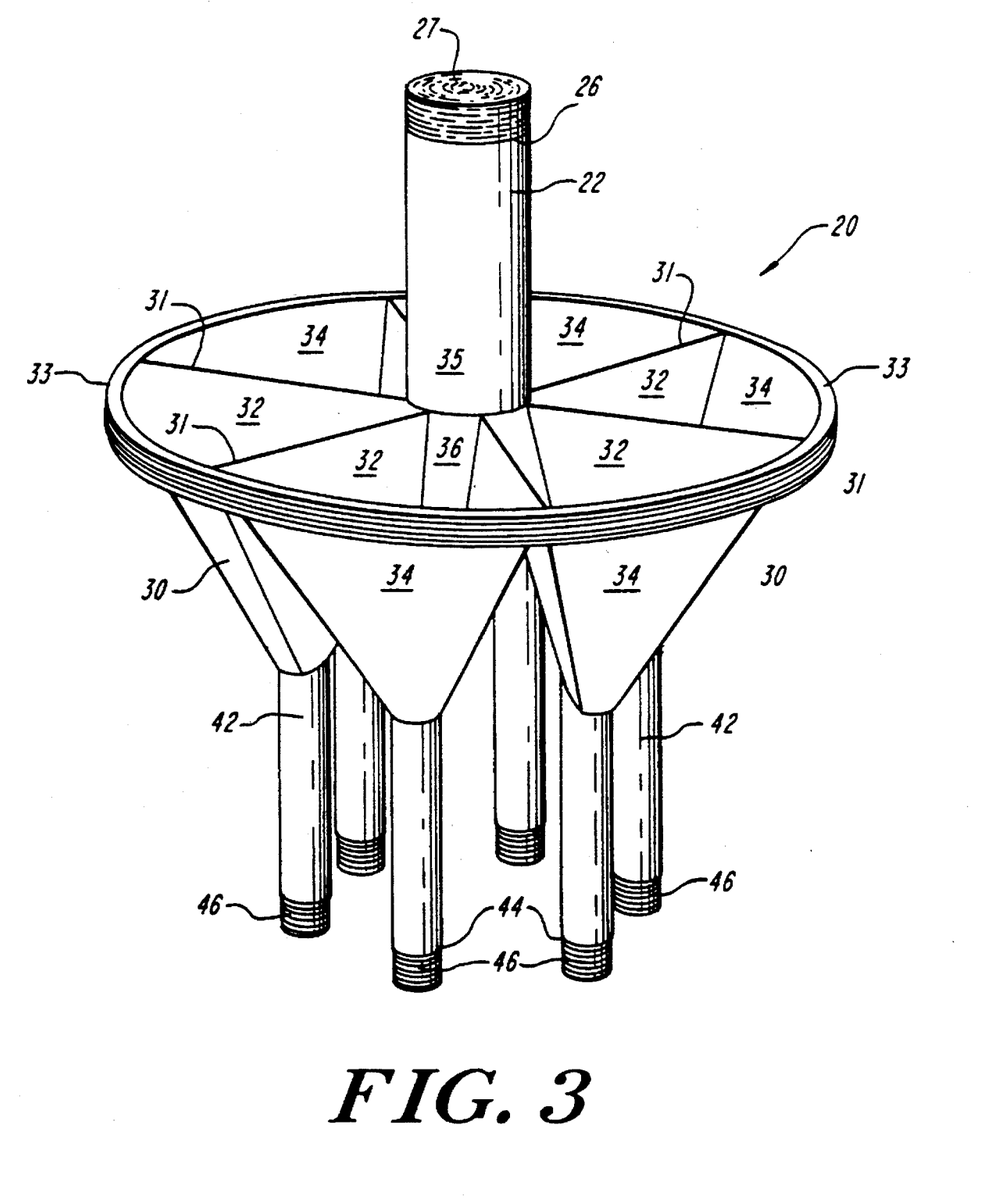
FIG. 3 is a perspective view of the filter-containing flow guide alone.
Figure 4:
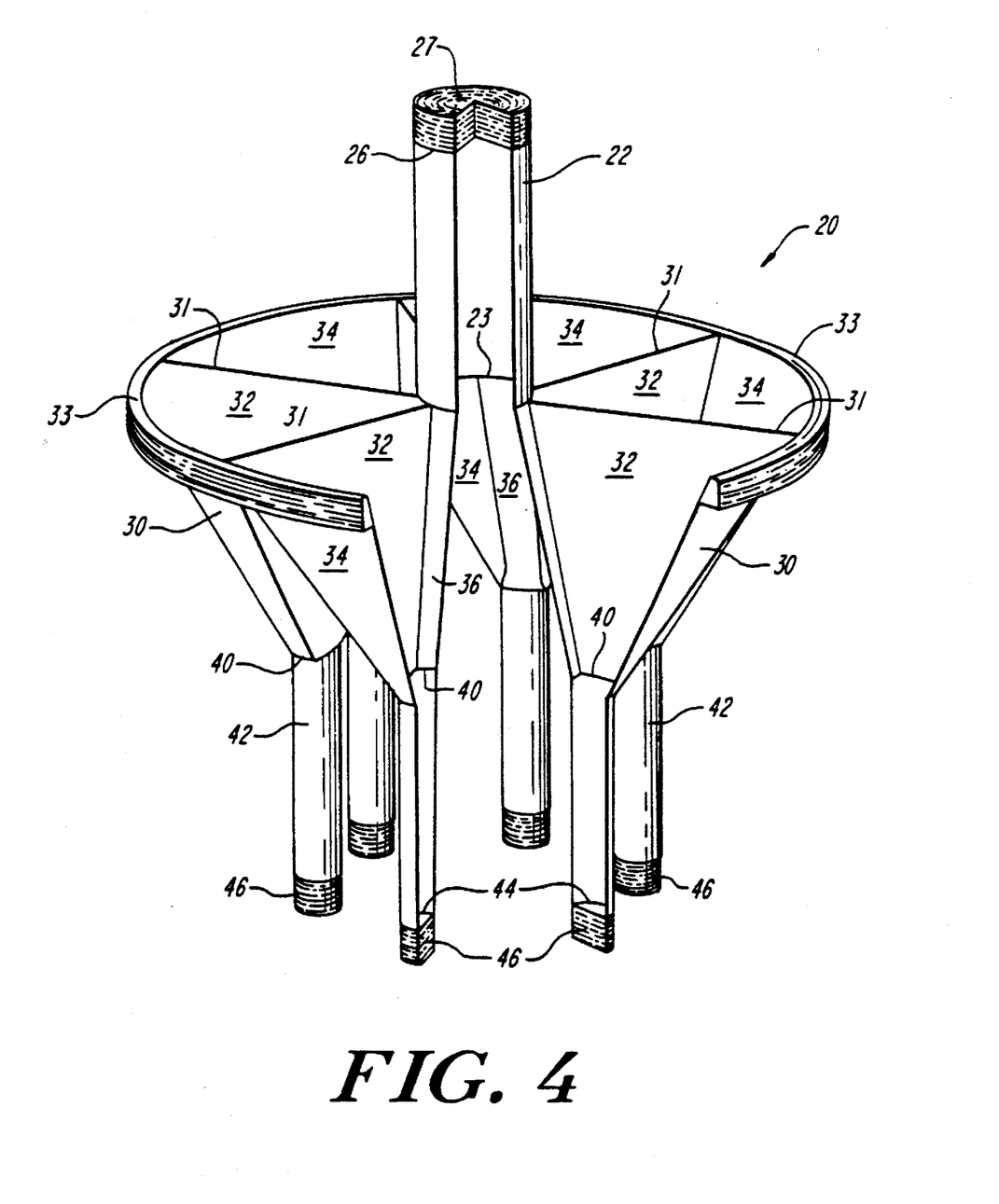
FIG. 4 is a cut-away perspective view of the filter-containing flow guide.

Against with reference to FIGS. 2–4, the funnel's second opening 40 may further open contiguously into an optional outlet tube 42 having a distal opening 44. The outlet tube 42 may further include an optional filter 46 proximate to the distal opening 44, to remove contaminant particles from the nutrient-depleted solution, including aluminum silicates, iron silicates, and other by-products of solvent interactions with the vessel 12 or the flow guide 20.

For non-impeded flow, the cross-sectional area of the inlet conduit preferably equals the sum of the cross-sectional areas of each funnel's narrowest point (e.g., the funnel's second opening 40) or, if present, of the outlet tubes 42. The funnel walls are preferably angled steeply, nearly vertically. This arrangement permits a steady, non-random, non-mixing flow in the preferred order: (i) flow of crystal nutrient-laden solution through the inlet conduit 22 to the growth chamber 14; and (ii) flow of nutrient-depleted solution through the funnels 30 and the outlet tubes 42, back into the dissolving zone 13. A most preferred embodiment, for use in standard hydrothermal autoclaves, has eight funnels 30 surrounding the inlet conduit 22. An eight-funnel arrangement allows the funnel walls 32, 34, and 36 to be steeper than is possible with only four funnels covering the same autoclave volume. Making the funnel walls as steeply angled for just four funnels as for eight, results in funnels tending to be too bulky and intrusive for a standard, commercially available hydrothermal autoclave, thereby tending to impede flow excessively and to decrease crystal productivity.

Also shown in FIG. 2, a filtering means 50—such as wire mesh, steel wool, other filtering material, or chemical adsorbants—may be packed between the funnels' outermost edges 33 and the vessel 12 to seal any space between the two, further reducing any random flow of solution between the dissolving and growth zones along the vessel walls and filtering out contaminants from the solution.

In the most preferred embodiment of FIG. 2, the heated nutrient-rich solution flows up through at least one central inlet conduit 22 through a central region of the growth zone 14—as indicated by arrows 24—where it deposits the nutrients onto racks of seed crystals 18. The cooled, nutrient-depleted solvent then flows along a peripheral region of the vessel 12 in the growth zone 14 to the dissolving zone 13 through the funnels 30 and outlets 42—as indicated by arrows 28. Upon the filtered solvent's return to the dissolving chamber 13, it can reheat and further dissolve remaining crystal nutrient supply 16.

Various configurations for the flow guide 20 are possible. Although not illustrated, one embodiment of the flow guide may have substantially reverse configurations from those shown in FIGS. 2–6, or be fitted upside-down in those hydrothermal apparatuses having a growth zone at the bottom of the autoclave, with the crystal nutrient supply— e.g., a basket of lascas—suspended in an upper dissolving zone. The flow guide may also be adapted for horizontal use—e.g., in a hydrothermal reaction vessel having the dissolving and growth zones side by side rather than atop each other and operating through forced convection.

Figure 5A:
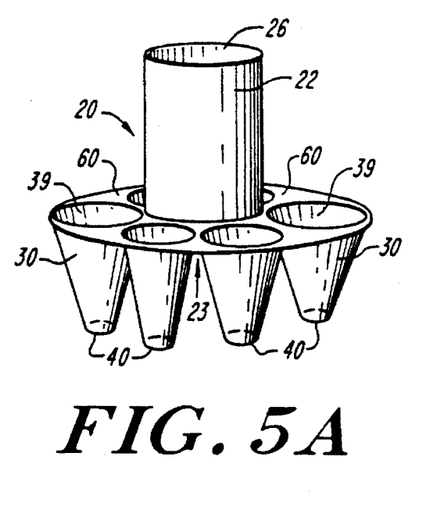
Figure 5B:
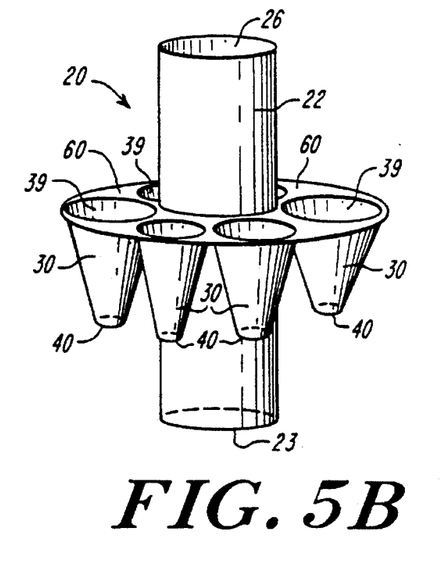
Figure 5C:
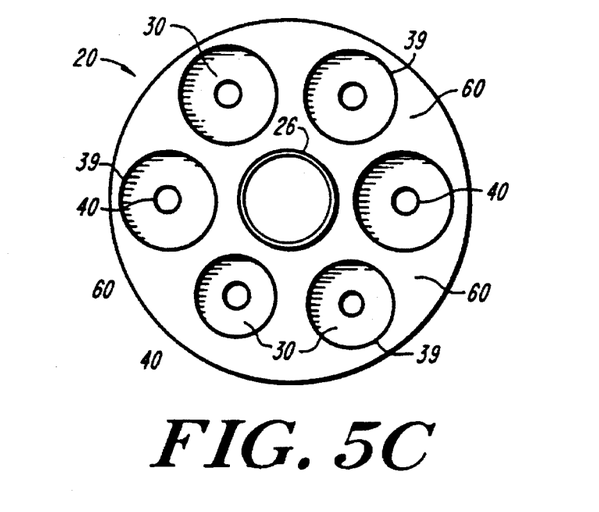
Figure 6A:
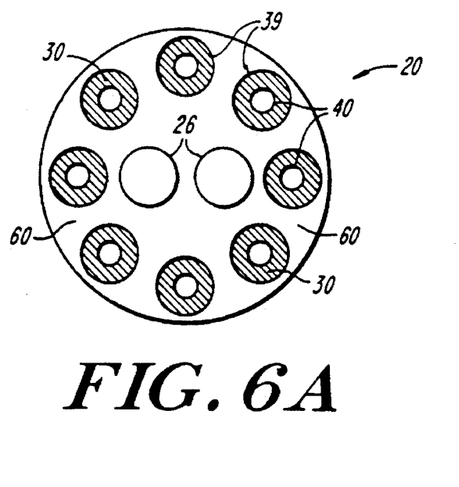
Figure 6B:
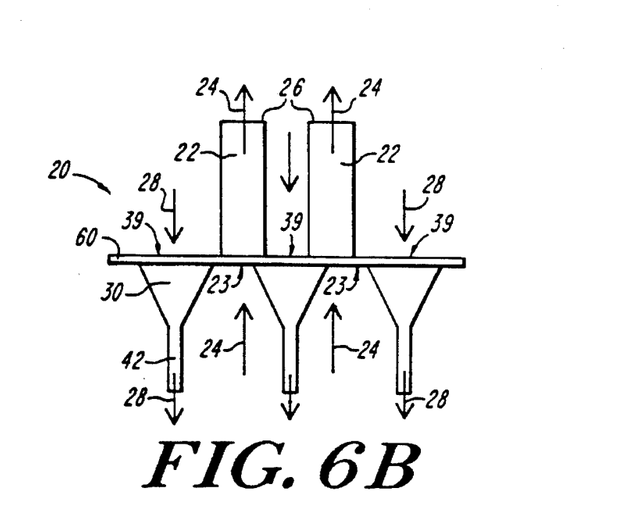
Figure 6C:
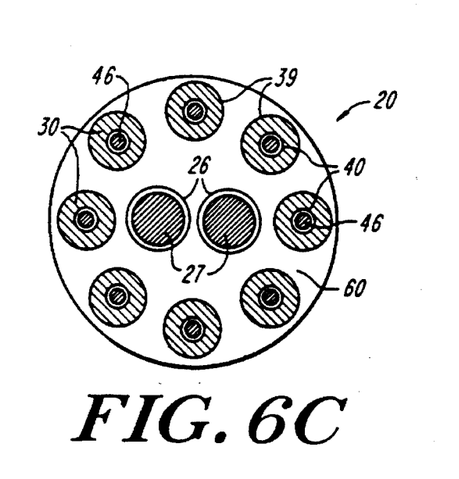
Figure 6D:
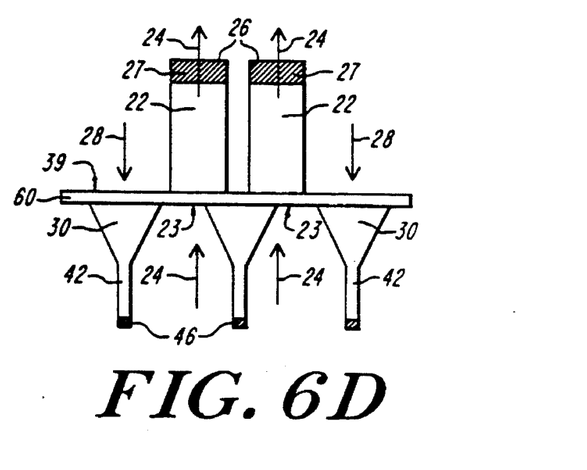

Alternatively, as shown in FIGS. 5(a)–(c), each outlet funnel 30 may have a substantially conical shape with substantially elliptical (e.g., circular) cross-sections as well as elliptical first and second openings 39 and 40. It is preferred but not essential that the funnels 30 are contiguous with each other and with the inlet conduit 22. A plurality of the funnels 30, while maintaining their radial configuration around the inlet conduit 22, may be slightly spaced apart from each other and the inlet conduit, but a sealant or connecting structure must then be disposed between the funnels and inlet conduit for support and to prevent random flow. For instance, a plurality of the funnels 30 may fit contiguously within a circular collar 60 which, in turn, sealably surrounds the inlet conduit 22. FIG. 5(a) shows the most preferred longitudinal relationship of the inlet conduit 22 to the outlet funnels 30, in which the inlet conduit's first opening 23 is proximate with each funnel's first opening 39, such that both openings occur at the boundary between the dissolving and growth zones when the flow guide 20 is placed within a hydrothermal reaction vessel. Alternatively, as in FIG. 5(b), the first opening 23 of the inlet conduit 22 may be positioned closer to the second openings 40 of the funnels 30, with the inlet conduit's first opening 23 protruding into the dissolving zone of a hydrothermal reaction vessel in which the flow guide 20 is placed. However, the inlet conduit's and the funnels' first openings 23 and 40 are preferred to coincide within the same cross-sectional plane (to be situated at the boundary between the dissolving and growth zones), to minimize any dead-space occurring between the inlet conduit 22 and the funnels 30 which could trap fluid or other material, or cause turbulence in solution flow from the dissolving to the growth zone.

Alternatively, FIG. 6(a)–(d) illustrates embodiments of the flow guide 20 providing more than one inlet conduit 22. Here, two inlet conduits 22 are centrally located within a radially surrounding collar 60 supporting a plurality of conical funnels 30. The cross-sectional area of each inlet conduit 22 should still exceed the individual cross-sectional area of each funnel's second opening 40; but the sum of the total inlet cross-sectional areas preferably remains substantially equal to the sum of the total outlet cross-sectional areas.

Figure 7A:
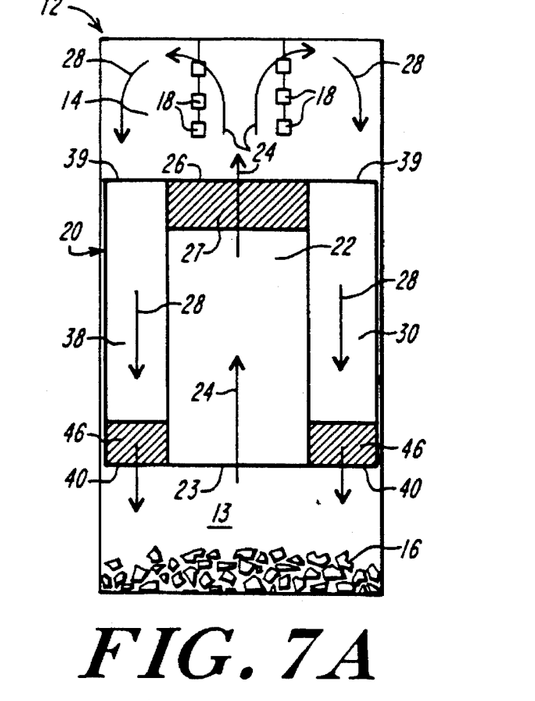
FIG. 7(a) and (b) are longitudinal, sectional views of two possible filter arrangements for a flow guide, drawn in schematic form and not to scale.
Figure 7B:
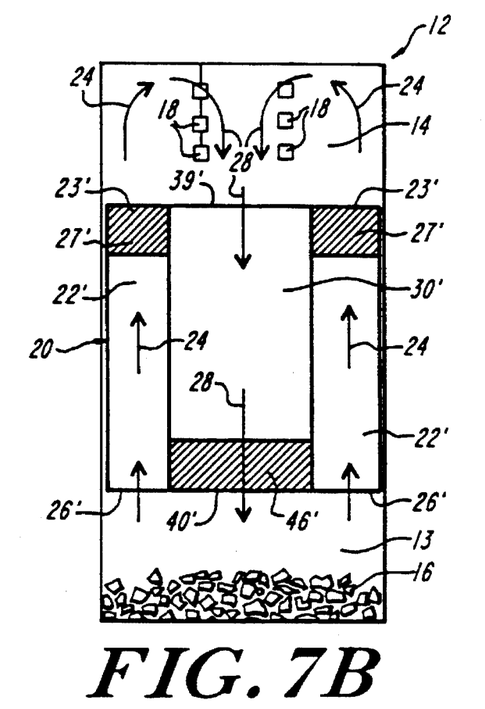

FIG. 7(a)–(b) focuses on the filtering aspect of the invention, providing longitudinal, schematic views of simple embodiments of filter arrangements for a flow guide 20. An efficient filtering effect can be achieved even with outlet funnels 30 which are substantially cylindrical tubes rather than tapering funnels, as long as the cross-sectional area of the inlet conduit 22 substantially equals the sum of the cross-sectional areas of the outlet funnels 30. Furthermore, various arrangements of filter-containing inlet and outlet conduits are possible to provide a filtering flow guide. Cylindrical outlet conduits 30 may radially and sealably abut at least one cylindrical inlet conduit 22 and each other, as for the embodiments of FIGS. 2–4, and FIG. 6(a). Alternatively, the relative positions of the outlet and inlet conduits could be reversed as in FIG. 6(b). Even a side-by-side arrangement is possible, wherein a single inlet conduit and a single outlet conduit each have, e.g., a semicircular cross-section, and sealably abutting each other so as to fit snugly within a cylindrical hydrothermal reaction vessel.

The important factor—especially for a non-tapering flow guide embodiment as in FIG. 7—is to have the inlet conduit filter 27 spaced apart from the outlet funnel filters 46 along the flow guide's longitudinal axis, to maintain directed convective flow while achieving effective filtration. Most preferably, the filter 27 may be disposed proximate to the inlet conduit's second opening 26, at a longitudinal distance from the filters 46 disposed near the second openings 40 of the funnels 30, as shown in FIG. 7(a). When this filter arrangement is placed within a hydrothermal reaction vessel 12, the filter 27 would be situated proximate with the growth zone 14 while the filter 46 would be proximate with the dissolving zone 13. Due to the differential flow resistance resulting from the spaced-apart arrangement of the filters 27 and 46 in a non-tapering flow guide 20, crystal nutrient-laden solution would tend to flow through the vessel's center from the dissolving to the growth zone, while crystal-depleted solution would tend to flow along the vessel's periphery from the growth to the dissolving zone.

Referring to FIG. 7(b), it is also possible to reverse the relative positions of the inlet and outlet conduit filters in the non-tapering flow guide 20, so as to promote an opposite flow direction. A plurality of peripheral inlet conduits sealably and radially abut at least one central outlet conduit 30 having a first opening 39' and a second opening 40'. A filter 46' is positioned within the central outlet tube 30' proximate to the second opening 40'. A filter 27' is positioned within each peripheral inlet tube 22' having a first opening 23' and a second opening 26', the filter 27' proximate to the second opening 26'. By placing a flow guide having this filter arrangement in a hydrothermal reaction vessel 12, one can promote convective flow of solution from the dissolving zone 13 to the growth zone 14 through the peripheral inlet tube 22' along the vessel's periphery (arrows 24') and then past the crystal seed racks 18. Solution would flow from the growth zone 14 back to the dissolving zone 13 through the centrally located outlet conduit 30' in the vessel's center (arrows 28').

Of course, both filtration and convective flow effects are maximized in the most preferred embodiment of the present filter-containing flow guide 20, shown in FIGS. 2–4. In summary, the entire configuration of the preferred flow guide's inlet conduit 22, funnels 30, and outlet tubes 42—both with and without the help of the filters 27 and 46—helps to guide the convection currents from the dissolving zone 13 into the growth zone 14 upward (arrows 24) through the center of the reaction vessel's interior, then back down (arrows 28) along the periphery of the vessel's interior to the dissolving chamber 13. The flow guide promotes well-defined, recirculating flow patterns within the growth and dissolving zones. This flow pattern results in more even crystal growth and a more uniform growth rate throughout the reaction vessel. Improved crystal quality is obtained with filters by reducing the inclusion or impurity density.

The flow guide of the present invention has been tested in conventional hydrothermal growth of electronic-grade quartz crystals at high pressures and temperatures, substantially as discussed previously. The present invention greatly improves the quality of crystals grown in conventional hydrothermal autoclaves. Table 1 compares the inclusion densities of electronic-grade α-quartz grown with and without the filter-containing flow guide 20.

TABLE 1

| Inclusion Dimensions | Average Inclusion Density (no. of inclusions/cm$^3$) | Worst-case Inclusion Density (no. of inclusions/cm$^3$) |
| --- | --- | --- |
| >100 micron, | | |
| without flow guide | 0.1 | 0.9 |
| with flow guide | 0.001 | 0.01 |
| 70–100 micron, | | |
| without flow guide | 0.8 | 2.5 |
| with flow guide | 0.01 | 0.2 |
| 30–70 micron, | | |
| without flow guide | 1.5 | 3.6 |
| with flow guide | 0.3 | 0.6 |

Analysis by scanning electron microscope (SEM) showed that α-quartz grown with this invention had significantly reduced amounts of inclusions—e.g., acmite ($NaFe(SiO_3)_2$) and emeleusite ($Li_2Na_4Fe_2Si_{12}O_{30}$)—as compared to crystals grown without the present filtering flow guide. For example, the average density of inclusions larger than 100 microns was 100 times less in crystals grown with the present filtering flow guide, than in crystals grown with conventional baffles. At the same time, use of the present filtering flow guide 20 maintains substantially the same crystal growth rate and flow velocities as hydrothermal crystal growth methods using standard perforated disk baffles. However, the flow guide 20 minimizes useless and wasteful crystallization along the reaction vessel walls, since the flow patterns promoted by the flow guide cause the nutrient-depleted solution to return along the vessel walls, which can dissolve any crystal deposits on the walls. More-over, the flow guide has been observed to reduce corrosion of the reaction vessel, as compared to conventional baffles. Analysis of residues—on and within the flow guide, and on the autoclave's bottom—show that small, unavoidable amounts of impurities (e.g., acmite, emeleusite) do occur, but are largely collected on the flow guide and its filters. Finally, this invention further improves over the prior art in that it is easily adapted to fit into standard crystal growth apparatus and eliminates the need for any other baffle, filter, or pump.

Further embodiments of the invention will be apparent to those skilled in the art from a consideration of this specification or the practice of the invention disclosed herein. It is intended that the specification and examples be considered as exemplary only, with the true scope and spirit of the invention being indicated by the following claims.

What is claimed is the following

1. A flow guide, comprising:
   (a) at least one inlet conduit having a first opening and a second opening; and
   (b) a plurality of funnels surrounding the at least one inlet conduit radially, each funnel tapering from a first opening to a second opening, a cross-sectional area of the funnel's first opening being greater than a cross-sectional area of the second opening, and each funnel sealably abutting at least one adjacent funnel and the at least one inlet conduit.

2. The flow guide of claim 1 wherein a narrowest cross-sectional area of the at least one inlet conduit substantially equals a sum total of each funnel's narrowest cross-sectional area.

3. A flow guide adapted for use in a hydrothermal crystal growth reaction vessel having dissolving and growth zones, the flow guide comprising:
   (a) at least one inlet conduit having a first opening and a second opening; and
   (b) a plurality of funnels surrounding the at least one inlet conduit radially, each funnel having a first opening and a second opening, a cross-sectional area of the funnel's first opening being greater than a cross-sectional area of the second opening, and each funnel sealably abutting at least one adjacent funnel and the at least one conduit;
   wherein the plurality of funnels separates the dissolving zone from the growth zone of the hydrothermal reaction vessel;
   whereby a temperature differential between the dissolving zone and the growth zone induces flow of a crystal nutrient-laden solution from the dissolving zone through the inlet conduit into the growth zone, and crystal nutrient-depleted solution flows from the growth zone through each of the funnels and into the dissolving zone.

4. The flow guide of claim 3, wherein a narrowest cross-sectional area of the at least one inlet conduit substantially equals a sum total of each funnel's narrowest cross-sectional area.

5. The flow guide of claim 1, 2, 3 or 4, wherein the plurality of funnels are supported within a collar, each funnel's first opening contiguous with the collar, and the collar sealably abutting and radially surrounding the at least one inlet conduit.

6. The flow guide of claim 1, 2, 3 or 4, further comprising:
   (c) a filter disposed within the inlet conduit, whereby impurities are trapped from solution flowing through the inlet conduit; and
   (d) a filter disposed within each funnel, whereby impurities are trapped from solution flowing through each funnel.

7. The flow guide of claim 6, wherein the plurality of funnels are supported within a collar, each funnel's first opening contiguous with the collar, and the collar sealably abutting and radially surrounding the at least one inlet conduit.

8. The flow guide of claim 1, 2, 3 or 4, further including, at each funnel, an outlet tube having a first opening and a second opening, the first opening of the outlet tube contiguous with the second opening of the funnel.

9. The flow guide of claim 8, further comprising:
   (c) a filter disposed within the at least one inlet conduit, whereby impurities are trapped from solution flowing through the inlet conduit; and
   (d) a filter disposed within the outlet tube, whereby impurities are trapped from solution flowing through the outlet tube.

10. The flow guide of claim 9, wherein a narrowest cross-sectional area of the inlet conduit substantially equals a sum total of each outlet tube's narrowest cross-sectional area.

11. The flow guide of claim 1, 2, 3, or 4, wherein the inlet opening of the at least one inlet conduit is proximate to each funnel's first opening.

12. The flow guide of claim 1, 2, 3, or 4, wherein the first opening of the inlet conduit is proximate to each funnel's second opening along a longitudinal axis of the flow guide.

13. The flow guide of claim 8, wherein the first opening of the inlet conduit is proximate to each outlet tube's second opening along a longitudinal axis of the flow guide.

14. The flow guide of claim 1, 2, 3, or 4, wherein the inlet conduit has a substantially elliptical cross-section and walls angled at less than twenty degrees from a longitudinal axis of the inlet conduit.

15. The flow guide of claim 8, wherein the inlet conduit has a substantially elliptical cross-section and walls angled at less than twenty degrees from a longitudinal axis of the inlet conduit.

16. The flow guide of claim 1, 2, 3, or 4, wherein each funnel is substantially configured as a hollow, inverted pyramid, the funnel's second opening located at a nadir of the inverted pyramid.

17. The flow guide of claim 8, wherein each funnel is substantially configured as a hollow, inverted pyramid, the funnel's second opening located at a nadir of the inverted pyramid.

18. The flow guide of claim 1, 2, 3, or 4, wherein each funnel comprises:
   (a) a curved innermost wall having a curved upper edge which abuts and is contiguous with the inlet conduit;
   (b) two substantially triangular lateral walls, each lateral wall substantially contiguous with the lateral wall of an adjacent funnel; and
   (c) a substantially triangular, curved outermost wall having a curved upper edge;
wherein the innermost and outermost walls are substantially parallel to each other and intersect the two lateral walls.

19. The flow guide of claim 18, further including:
   (i) at each funnel, an outlet tube having a first opening and a second opening, the first opening of the outlet tube contiguous with the second opening of each funnel;
   (ii) a filter disposed within the at least one inlet conduit, whereby impurities are trapped from solution flowing through the inlet conduit; and
   (iii) a filter disposed within each outlet tube, whereby impurities are trapped from solution flowing through the outlet tube.

20. A filtering flow guide for a hydrothermal reaction vessel, comprising:
(a) at least one inlet conduit having a first opening and a second opening, a filter disposed within the at least one inlet conduit; and
(b) at least one outlet conduit having a first opening and a second opening, a filter disposed within the at least one outlet conduit, the at least one outlet conduit sealably abutting the inlet conduit;
wherein the inlet conduit filter is spaced apart from the outlet conduit filter along a longitudinal axis of the flow guide.

21. The flow guide of claim 20, wherein the inlet conduit filter is disposed proximate to the second opening of the at least one inlet conduit, and the outlet conduit filter is disposed proximate to the second opening of the at least one outlet conduit.

22. The flow guide of claim 20, including a plurality of outlet conduits radially surrounding the at least one inlet conduit, each outlet conduit sealably abutting at least one adjacent outlet conduit and the at least one inlet conduit.

23. The flow guide of claim 20, including a plurality of inlet conduits radially surrounding the at least one outlet conduit, each inlet conduit sealably abutting at least one adjacent inlet conduit and the at least one outlet conduit.

24. The flow guide of claim 20, 21, 22, or 23, wherein a total, narrowest cross-sectional area of the at least one inlet conduit substantially equals a total, narrowest cross-sectional area of the at least one outlet conduit.

25. A method for improving a hydrothermal crystal growth reaction, comprising the steps of:
(a) providing at least one inlet conduit having a first opening and a second opening within a hydrothermal reaction vessel for guiding solution flow from a dissolving zone to a growth zone of the reaction vessel through a central interior of the reaction vessel; and
(b) providing a plurality of funnels within the hydrothermal reaction vessel for guiding solution flow from the growth zone to the dissolving zone through a peripheral interior of the reaction vessel, each funnel tapering from a first opening to a second opening, a cross-sectional area of the funnel's first opening being greater than the second opening's cross-sectional area, and each funnel sealably abutting at least one adjacent funnel and the inlet conduit so as to surround the inlet conduit radially.

26. The method of claim 25, further comprising the step of:
(c) providing a solution-filtering means within the hydrothermal reaction vessel at a boundary between the dissolving and growth zones of the reaction vessel.

27. A hydrothermal crystal growth apparatus, comprising:
a hydrothermal reaction vessel comprising: a dissolving zone adapted to hold a crystal nutrient supply and a starting volume of crystal-dissolving solution; a growth zone contiguous with the dissolving zone, the growth zone adapted to support at least one starting seed crystal and a final crystal growth product; a sealable opening at one end of the hydrothermal reaction vessel; and a sealing closure adapted to fit the sealable opening;
controllable heaters surrounding the hydrothermal reaction vessel, for heating and maintaining the dissolving and growth zones at adjustably different temperatures; and
a flow guide fitting within the hydrothermal reaction vessel at an interface between the dissolving zone and growth zone, so that a perimeter of the flow guide sealably abuts an interior surface of the reaction vessel, the flow guide comprising:
(a) at least one inlet conduit having a first opening and a second opening; and
(b) a plurality of funnels surrounding the at least one inlet conduit radially, each funnel tapering from a first opening to a second opening, a cross-sectional area of the funnel's first opening being greater than a cross-sectional area of the second opening, and each funnel sealably abutting at least one adjacent funnel and the at least one inlet conduit.

28. The hydrothermal crystal growth apparatus of claim 27; wherein the flow guide further includes, at each funnel, an outlet tube having a first opening and a second opening, the first opening of the outlet tube contiguous with the second opening of the funnel.

29. The hydrothermal crystal growth apparatus of claim 27, further comprising a sealing means adapted to fit between the flow guide and the interior surface of the reaction vessel.

30. The hydrothermal crystal growth apparatus of claim 29, wherein the sealing means is wire mesh.

31. The hydrothermal crystal growth apparatus of claim 29, wherein the sealing means is steel wool.

32. The hydrothermal crystal growth apparatus of claim, 27 wherein a narrowest cross-sectional area of the at least one inlet conduit substantially equals a sum total of each funnel's narrowest cross-sectional area.

33. A hydrothermal crystal growth apparatus, comprising:
a hydrothermal reaction vessel comprising: a dissolving zone adapted to hold a crystal nutrient supply and a starting volume of crystal-dissolving solution; a growth zone contiguous with the dissolving zone, the growth zone adapted to support at least one starting seed crystal and a final crystal growth product; a sealable opening at one end of the hydrothermal reaction vessel; and a sealing closure adapted to fit the sealable opening;
controllable heaters surrounding the hydrothermal reaction vessel, for heating and maintaining the dissolving and growth zones at adjustably different temperatures; and
a flow guide fitting within the hydrothermal reaction vessel at an interface between the dissolving zone and growth zone, so that a perimeter of the flow guide sealably abuts an interior surface of the reaction vessel, the flow guide comprising:
(a) at least one inlet conduit having a first opening and a second opening; and
(b) a plurality of funnels surrounding the at least one inlet conduit radially, each funnel having a first opening and a second opening, a cross-sectional area of the funnel's first opening being greater than a cross-sectional area of the second opening, and each funnel sealably abutting at least one adjacent funnel and the at least one inlet conduit;
wherein the plurality of funnels separates the dissolving zone from the growth zone in the hydrothermal reaction vessel; and
whereby a temperature differential between the dissolving zone and the growth zone induces flow of a crystal nutrient-laden solution from the dissolving zone through the inlet conduit into the growth zone, and crystal nutrient-depleted solution flows from the growth zone through each of the funnels and into the dissolving zone.

34. The hydrothermal crystal growth apparatus of claim 33, wherein a narrowest cross-sectional area of the at least one inlet conduit substantially equals a sum total of each funnel's narrowest cross-sectional area.

35. The hydrothermal crystal growth apparatus of claim 33, wherein the flow guide further includes, at each funnel, an outlet tube having a first opening and a second opening, the first opening of the outlet tube contiguous with the second opening of the funnel.

36. The hydrothermal crystal growth apparatus of claim 33, wherein the flow guide further includes, at each funnel, an outlet tube having a first opening and a second opening, the first opening of the outlet tube contiguous with the second opening of the funnel.

37. The hydrothermal crystal growth apparatus of claim 34, wherein the flow guide further includes, at each funnel, an outlet tube having a first opening and a second opening, the first opening of the outlet tube contiguous with the second opening of the funnel.

38. The hydrothermal crystal growth apparatus of claim 28, 35, 36 or 37, further comprising:
 (c) a filter disposed within the at least one inlet conduit, whereby impurities are trapped from solution flowing through the inlet conduit; and
 (d) a filter disposed within the outlet tube, whereby impurities are trapped from solution flowing through the outlet tube.

39. The hydrothermal crystal growth apparatus of claim 38, further comprising a sealing means adapted to fit between the flow guide and the interior surface of the reaction vessel.

40. The hydrothermal crystal growth apparatus of claim 39, wherein the sealing means is wire mesh.

41. The hydrothermal crystal growth apparatus of claim 39, wherein the sealing means is steel wool.

* * * * *

UNITED STATES PATENT AND TRADEMARK OFFICE
CERTIFICATE OF CORRECTION

PATENT NO. : 5,456,204
DATED : October 10, 1995
INVENTOR(S) : Vesselin S. Dimitrov et al.

It is certified that error appears in the above-indentified patent and that said Letters Patent is hereby corrected as shown below:

On the title page, item [73], after "Alfa Quartz, C.A. " please delete "Cua" and insert therefor --Charallave, Estado Miranad Venezuela --.

Signed and Sealed this

Sixth Day of August, 1996

*Attest:*

BRUCE LEHMAN

*Attesting Officer*  *Commissioner of Patents and Trademarks*